United States Patent
Bai

(10) Patent No.: US 9,941,920 B2
(45) Date of Patent: Apr. 10, 2018

(54) ADAPTIVE MATCHING RF ARCHITECTURE AND ASSOCIATED MATCHING METHOD

(71) Applicant: Huizhou TCL Mobile Communication Co., Ltd., Huizhou, Guangdong (CN)

(72) Inventor: Jian Bai, Guangdong (CN)

(73) Assignee: Huizhou TCL Mobile Communication Co., Ltd., Huizhou, Guangdong (CN)

( * ) Notice: Subject to any disclaimer, the term of this patent is extended or adjusted under 35 U.S.C. 154(b) by 241 days.

(21) Appl. No.: 14/902,071

(22) PCT Filed: Feb. 9, 2015

(86) PCT No.: PCT/CN2015/072566
§ 371 (c)(1),
(2) Date: Dec. 30, 2015

(87) PCT Pub. No.: WO2016/074358
PCT Pub. Date: May 19, 2016

(65) Prior Publication Data
US 2016/0308573 A1    Oct. 20, 2016

(30) Foreign Application Priority Data
Nov. 10, 2014 (CN) .......................... 2014 1 0633089

(51) Int. Cl.
*H04B 1/40* (2015.01)
*H04W 16/18* (2009.01)
*H04B 1/18* (2006.01)

(52) U.S. Cl.
CPC ................. *H04B 1/40* (2013.01); *H04B 1/18* (2013.01); *H04W 16/18* (2013.01)

(58) Field of Classification Search
CPC ............ H04B 1/40; H04B 1/18; H04W 16/18
USPC ........................................................... 455/77
See application file for complete search history.

(56) References Cited

U.S. PATENT DOCUMENTS

| | | | |
|---|---|---|---|
| 2006/0183431 A1* | 8/2006 | Chang ................. | H04B 1/0458 455/69 |
| 2012/0064894 A1 | 3/2012 | Liu et al. | |
| 2013/0107926 A1* | 5/2013 | Xia ..................... | H03G 3/3042 375/224 |

FOREIGN PATENT DOCUMENTS

| | | |
|---|---|---|
| CN | 1822512 A | 8/2006 |
| CN | 101557236 A | 10/2009 |
| CN | 101945498 A | 1/2011 |
| CN | 101997946 A | 3/2011 |

(Continued)

*Primary Examiner* — Raj Chakraborty
(74) *Attorney, Agent, or Firm* — Andrew C. Cheng

(57) ABSTRACT

An adaptive matching RF architecture and an associated matching method are provided. The RF architecture comprises a power amplifier module, a receiving module, an antenna, an RF processing module, a baseband control module and at least one adjustable matching network module, the at least one adjustable matching network module being connected between the power amplifier module and the RF processing module, and/or between the receiving module and the RF processing module, and/or between the antenna and the RF processing module. The baseband control module is pre-stored with multiple matching values corresponding to multiple different application scenarios, the matching values of the at least one adjustable network module being applied based on the application scenarios to attain the optimum RF performance.

20 Claims, 1 Drawing Sheet

(56) References Cited

FOREIGN PATENT DOCUMENTS

CN            102412861 A      4/2012
CN            103384155 A      11/2013

\* cited by examiner

ADAPTIVE MATCHING RF ARCHITECTURE AND ASSOCIATED MATCHING METHOD

FIELD OF THE DISCLOSURE

The present disclosure relates to the field of portable electronic devices, and more particularly, to an adaptive matching radio frequency architecture and an associated matching method.

BACKGROUND OF THE DISCLOSURE

In traditional radio frequency (RF) architecture, the matching network is fixed, i.e., once selected and produced, it is unchangeable. However, today's communication terminals have stepped into an era of multi-mode and multi-band, with the working band becoming increasingly higher and higher. For example, the working band of WIFI has reached 5 Hz, and that of 4G has reached 2.6 GHz. Furthermore, the communication bandwidth is also broadening continuously. For example, the bandwidth range of 5G will has approached 1 GHz, and the communication bandwidth range of 4G has approached 200 MHz. While in a communication circuit with high band and large bandwidth, using only one set of matching networks to undertake the tuning of all working frequency points is a very difficult task. Meanwhile, in the frequency division duplex mode (FDD), a critical non-linear unit applied in the RF path, the duplexer, will also make the system RF loads more non-convergent, thus increasing the tuning difficulty. If the traditional fixed matching mode is insisted, then the final performance will be a result of a balance among each frequency point/working state, and thus cannot achieve the optimum performance. It is worth mentioning that the RF performance of the system (for example, transceiving performance) will directly affect the user experience and the terminal's endurance. Therefore, adjustable matching network technologies would be necessitated to replace the traditional fixed matching network, enabling the network to adaptively adjust values of the matching networks based on different working conditions, and finally achieving the optimum performance at various frequency points under various working conditions.

SUMMARY OF THE DISCLOSURE

A technical problem to be solved by the present disclosure is to provide an adaptive matching RF architecture and an associated matching method, which is capable of adaptively adjusting values of the matching networks based on different working conditions, and thus can achieve the optimum performance at various frequency points under various working conditions.

To solve the above technical issue, the present disclosure provides an adaptive matching RF architecture, comprising a power amplifier module, a receiving module, an antenna, an RF processing module, a baseband control module and at least one adjustable matching network module, the at least one adjustable matching network module being connected between the power amplifier module and the RF processing module, and/or between the receiving module and the RF processing module, and/or between the antenna and the RF processing module; wherein the baseband control module is pre-stored with multiple matching values corresponding to multiple different application scenarios, with the matching values of the at least one adjustable network module being applied based on the application scenarios to attain an optimum RF performance; the baseband control module is configured to plan the RF application scenarios, test the application scenarios and determine the corresponding matching values, and make a lookup table and store the same; the application scenarios comprise at least one of a working channel, an ambient temperature, antenna load matching, and software specifying.

The baseband control module may further be configured to determine the current application scenario, search the lookup table according to the current application scenario to acquire the corresponding matching values of the at least one adjustable matching network module, and configure the adjustable matching network module based on the corresponding matching values of the at least one adjustable matching network module to attain the optimum RF performance.

The baseband control module may configure the matching values of the at least one adjustable matching network module through a hardware interface so as to attain the optimum RF performance.

The at least one adjustable matching network module may include but is not limited to an adjustable inductor or an adjustable capacitor.

To solve the above technical issue, the present disclosure provides an adaptive matching RF architecture, comprising a power amplifier module, a receiving module, an antenna, an RF processing module, a baseband control module and at least one adjustable matching network module, the at least one adjustable matching network module being connected between the power amplifier module and the RF processing module, and/or between the receiving module and the RF processing module, and/or between the antenna and the RF processing module; wherein the baseband control module is pre-stored with multiple matching values corresponding to multiple different application scenarios, with the matching values of the at least one adjustable network module being applied based on the application scenarios to attain the optimum RF performance.

The baseband control module may be configured to plan the RF application scenarios, test the application scenarios and determine the corresponding matching values, and make a lookup table and store the same.

The baseband control module may further be configured to determine the current application scenario, search the lookup table according to the current application scenario to acquire the corresponding matching values of the at least one adjustable matching network module, and configure the adjustable matching network module based on the corresponding matching values of the at least one adjustable matching network module to attain the optimum RF performance.

The baseband control module may configure the matching values of the at least one adjustable matching network module through the hardware interface so as to attain the optimum RF performance.

The at least one adjustable matching network module may include, but is not limited to, an adjustable inductor or an adjustable capacitor.

The application scenarios may include at least one of a working channel, an ambient temperature, antenna load matching, and software specifying.

To solve the above technical issue, the present disclosure provides a RF architecture matching method, the RF architecture comprising a power amplifier module, a receiving module, an antenna, an RF processing module, a baseband control module and at least one adjustable matching network module, the at least one adjustable matching network module being connected between the power amplifier module and the RF processing module, and/or between the receiving module and the RF processing module, and/or between the antenna and the RF processing module; the matching method comprises: pre-storing, by the baseband control module, multiple matching values corresponding to multiple different application scenarios, and applying the corresponding matching values of the at least one adjustable matching network module according to the application scenarios to attain the optimum RF performance.

The step of pre-storing by the baseband control module the multiple matching values corresponding to multiple different application scenarios may include: planning by the baseband control module the RF application scenarios; testing the application scenarios to determine the corresponding matching values, and making a lookup table and storing the same.

The step of applying by the baseband control module the corresponding matching values of the at least one adjustable matching network module according to the application scenarios to attain the optimum RF performance may include: determining by the baseband control module the current application scenario; searching the lookup table according to the current application scenario to acquire the corresponding matching values of the at least one adjustable matching network module; and configuring the adjustable matching network module based on the corresponding matching values of the at least one adjustable matching network module to attain the optimum RF performance.

The application scenarios may include at least one of a working channel, an ambient temperature, antenna load matching, and software specifying.

By the above solutions, the present disclosure provides the following beneficial effects: the RF architecture comprises a power amplifier module, a receiving module, an antenna, an RF processing module, a baseband control module and at least one adjustable matching network module, the at least one adjustable matching network module being connected between the power amplifier module and the RF processing module, and/or between the receiving module and the RF processing module, and/or between the antenna and the RF processing module; wherein the baseband control module is pre-stored with multiple matching values corresponding to multiple different application scenarios, with the matching values of the at least one adjustable network module being applied based on the application scenarios to attain the optimum RF performance, thus enabling the network to adaptively adjust the values of the matching networks based on different working conditions, and finally achieving the optimum performance at various frequency points under various working conditions.

DETAILED DESCRIPTION OF THE DISCLOSURE

Figure 1:
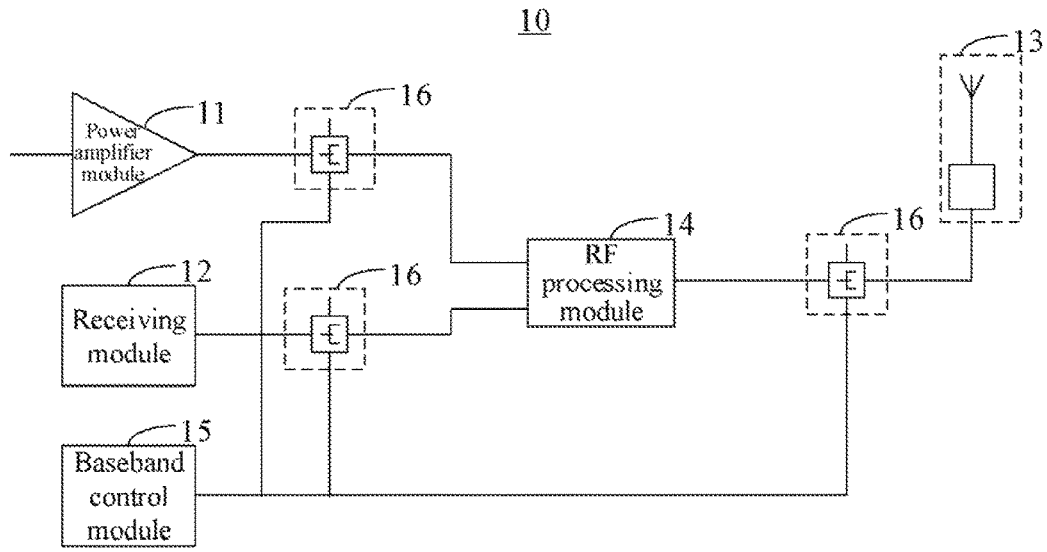
FIG. 1 is a structure diagram illustrating an adaptive matching RF architecture according to a first embodiment of the present disclosure.

Referring now to FIG. 1, a structure diagram illustrating an adaptive matching RF architecture according to a first embodiment of the present disclosure is shown. As is shown in FIG. 1, the RF architecture 10 comprises a power amplifier module 11, a receiving module 12, an antenna 13, a RF processing module 14, a baseband control module 15 and at least one adjustable matching network module 16. The at least one adjustable matching network module 16 may be connected between the power amplifier module 11 and the RF processing module 14, and/or between the receiving module 12 and the RF processing module 14, and/or between the antenna 13 and the RF processing module 14. The baseband control module 15 may be pre-stored with multiple matching values corresponding to multiple different application scenarios, the matching values of the at least one adjustable network module 16 being applied based on the application scenarios to attain an optimum RF performance. The RF architecture 10 with such a structure is capable of adaptively adjusting the values of the matching networks based on different working conditions, and finally achieving the optimum performance at various frequency points under various working conditions.

According to an embodiment, the adjustable matching network module 16 may include, but is not limited to, an adjustable device such as, for example, an adjustable inductor or an adjustable capacitor. The adjustable matching network module 16 is controlled by software of the baseband control module 15. The baseband control module 15 may store, in advance, matching values corresponding to multiple application scenarios into the software or a non-volatile storage. Specifically, the baseband control module 15 may first plan the RF application scenarios, and then test the application scenarios to determine the corresponding matching values, and make a lookup table and store the same. For example, the LTE band 7 is planned into 3 different application scenarios, namely, a low channel group work scenario Case 1 (i.e., a downstream channel 2750-2850), an intermediate channel group work scenario Case 2 (i.e., a downstream channel 2851-3425), and a high channel group work scenario Case 3 (i.e., a downstream channel 3426-3360). Regarding Case 1, the matching of the CH2750-2850 channel will be specially adjusted, and since focusing on a narrower band, the matching can be tested to the optimum, with the final matching value being Match 1. Regarding Case 2, the matching of the CH2851-3425 channel will be specially adjusted, and since focusing on a narrower band, the matching can be tested to the optimum, with the final matching value being Match 2. Regarding Case 3, the matching of the CH3426-3360 channel will be specially adjusted, and since focusing on a narrower band, the matching can be adjusted to the optimum, with the final matching value being Match 3. Finally, the application scenarios Case 1, Case 2 and Case 3 and the corresponding matching values Match 1, Match 2 and Match 3 will be organized as a lookup table, which will be stored into software or a non-volatile storage. The application scenarios may include at least one of a working channel, an ambient temperature, the antenna load matching and the software specifying, and can certainly be other application scenarios that may cause the matching values in the adjustable matching network module 16 to change, and thus are not limited herein.

The user may, in actual use, utilize the baseband control module 15 to monitor in real time through software the application scenario currently used, and to determine the current application scenario. When conditions for a certain application scenario are met, the lookup table will be searched based on the current application scenario to acquire the matching values of the at least one adjustable matching network module 16 that correspond to the current application scenario. And the adjustable matching network module 16 may be configured based on the corresponding matching values of the at least one adjustable matching network module 16 to attain the optimum RF performance. Specifically, the baseband control module 15 may configure the matching values of the adjustable matching network module 16 through a hardware interface so as to attain the optimum RF performance. Henceforth, in such a working scenario, its RF matching is the optimum solution, and thus can attain the best RF performance. The best RF performance may include, but is not limited to, optimum power consumption, an optimum receptivity, and so on.

According to an embodiment of the present disclosure, an adjustable matching network module 16 may only be applied between the antenna 13 and the RF processing module 14, while a traditional RF matching network connection is applied between the receiving module 12 and the RF processing module 14 and between the power amplifier module 11 and the RF processing module 14. Namely, the adjustable matching network module 16 is placed in the transmitting path of the RF architecture 10, thus enabling the transmitting matching network to dynamically adjust based on changing of the conditions, so as to achieve the optimum results under such condition. The optimum results mentioned above may include, but are not limited to, optimization of power consumption, improvement of linearity under various conditions, enhancement of cluster suppression performance in emission, and so on. The adjustable matching network module 16 can also be only applied between the receiving module 12 and the RF processing module 14. Namely, the adjustable matching network module 16 is placed in the receiving path of the RF architecture 10, thus enabling the receiving matching network to dynamically adjust based on the changing of the conditions, so as to achieve the optimum results under such condition. The optimum results mentioned herein may include, but are not limited to, optimization of system power consumption, enhancement of sensitivity and anti-interference performance under various conditions, and so on. Or the adjustable matching network module 16 can also be only applied between the power amplifier module 11 and the RF processing module 14. Namely, the adjustable matching network module 16 is placed in the rear-end path of the RF architecture 10, thus enabling the transmitting matching network to dynamically adjust based on the changing of the conditions, so as to achieve the optimum results under such condition. The optimum results mentioned herein may include, but are not limited to, optimization of system power consumption, improvement of linearity under various conditions, improvement of cluster suppression performance in emission, enhancement of sensitivity and anti-interference performance, and so on. According to other embodiments of the present disclosure, the adjustable matching network module 16 can be placed at any two of the positions between the power amplifier module 11 and the RF processing module 14, between the receiving module 12 and the RF processing module 14, and between the antenna 13 and the RF processing module 14, and can also be placed between all three of the positions between the power amplifier module 11 and the RF processing module 14, between the receiving module 12 and the RF processing module 14, and between the antenna 13 and the RF processing module 14, so as to enable the matching networks of the RF architecture 10 to adjust values of the matching networks based on different working conditions, thus finally attaining the optimum performance at various frequency points under various working conditions.

Figure 2:
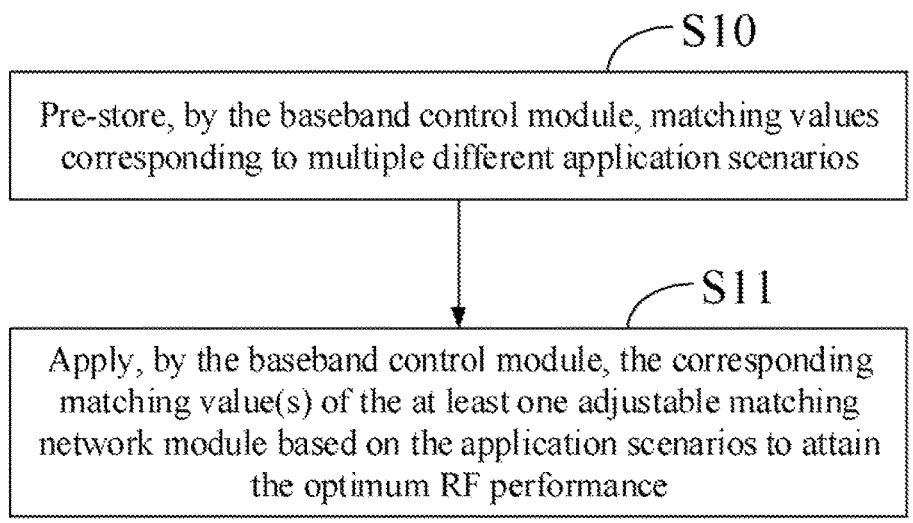
FIG. 2 is a flow chart illustrating a RF architecture matching method according to the first embodiment of the present disclosure.

Referring now to FIG. 2, there is shown a flow chart illustrating a RF architecture matching method according to the first embodiment of the present disclosure. The RF architecture comprises a power amplifier module, a receiving module, an antenna, a RF processing module, a baseband control module and at least one adjustable matching network module. The at least one adjustable matching network module is connected between the power amplifier module and the RF processing module, and/or between the receiving module and the RF processing module, and/or between the antenna and the RF processing module. As is shown in FIG. 2, the matching method of the adaptive matching RF architecture comprises:

Step S10: Pre-storing, by the baseband control module, matching values corresponding to multiple different application scenarios.

In the step S10: the baseband control module may store, in advance, the matching values corresponding to multiple application scenarios into software or a non-volatile storage. Specifically, the baseband control module may first plan the RF application scenarios, and then test the application scenarios to determine the corresponding matching values, and make a lookup table and store the same. The application scenarios may include at least one of a working channel, an ambient temperature, antenna load matching, and software specifying, and can certainly be other application scenarios that may cause the matching values in the adjustable matching network module to change, and thus are not limited herein.

Step S11: Applying, by the baseband control module, the corresponding matching values of the at least one adjustable matching network module based on the application scenarios so as to attain the optimum RF performance.

The user may, in actual use, utilize the baseband control module to monitor in real time through software the application scenario currently used, and to determine the current application scenario. When the conditions for a certain application scenario are met, the lookup table will be searched based on the current application scenario to acquire the matching values of the at least one adjustable matching network module that correspond to the current application scenario. And the adjustable matching network module may be configured based on the corresponding matching values of the at least one adjustable matching network module to attain the optimum RF performance. Specifically, the baseband control module may configure the matching value of the adjustable matching network module through a hardware interface so as to attain the optimum RF performance. Henceforth, in such a working scenario, its RF matching is the optimum solution and thus can attain the best RF performance. The best RF performance may include, but is not limited to, optimum power consumption, optimum receptivity, and so on.

According to an embodiment of the present disclosure, an adjustable matching network module may only be applied between the antenna and the RF processing module, while a traditional RF matching network connection is applied between the receiving module and the RF processing module and between the power amplifier module and the RF processing module. Namely, the adjustable matching network module is placed in the transmitting path of the RF architecture, thus enabling the transmitting matching network to dynamically adjust based on changing of the conditions, so as to achieve the optimum results under such condition. The optimum results mentioned above may include, but are not limited to, optimization of power consumption, improvement, of linearity under various conditions, enhancement of cluster suppression performance in emission, and so on. The adjustable matching network module can also be only applied between the receiving module and the RF processing module. Namely, the adjustable matching network module is placed in the receiving path of the RF architecture, thus enabling the receiving matching network to dynamically adjust based on the changing of the conditions, so as to achieve the optimum results under such condition. The optimum results mentioned herein may include, but are not limited to, optimization of system power consumption, enhancement of sensitivity and anti-interference performance, and so on. Or the adjustable matching network module can also be only applied between the power amplifier module and the RF processing module. Namely, the adjustable matching network module is placed in the rear-end path of the RF architecture, thus enabling the transmitting matching network to dynamically adjust based on the changing of the conditions, so as to achieve the optimum results under such condition. The optimum results mentioned herein may include, but are not limited to, optimization of system power consumption, improvement of linearity under various conditions, improvement of cluster suppression performance in emission, enhancement of sensitivity and anti-interference performance under various conditions, and so on. According to other embodiments of the present disclosure, the adjustable matching network module can be placed at any two of the positions between the power amplifier module and the RF processing module, between the receiving module and the RF processing module, and between the antenna and the RF processing module, and can also be placed at all three of the positions between the power amplifier module and the RF processing module, between the receiving module and the RF processing module, and between the antenna and the RF processing module, so as to enable the matching networks of the RF architecture to adjust values of the matching networks based on different working conditions, thus finally attaining the optimum performance at various frequency points under various working conditions.

As is stated above, the RF architecture of the present disclosure comprises a power amplifier module, a receiving module, an antenna, an RF processing module, a baseband control module and at least one adjustable matching network module, the at least one adjustable matching network module being connected between the power amplifier module and the RF processing module, and/or between the receiving module and the RF processing module, and/or between the antenna and the RF processing module. The baseband control module is pre-stored with multiple matching values corresponding to multiple different application scenarios, the matching values of the at least one adjustable network module being applied based on the application scenarios to attain the optimum RF performance, thus enabling the network to adaptively adjust the values of the matching networks based on different working conditions, and finally achieving the optimum performance at various frequency points under various working conditions.

What is described above is merely embodiments of the present disclosure, thus shouldn't be construed to be limiting the patent scope of the present disclosure. Any equivalent structures or equivalent process flow modifications that are made according to the specification and the attached drawings of the present disclosure, or any direct or indirect applications of the present disclosure in other related technical fields shall all be covered within the scope of the present disclosure.

What is claimed is:

1. An adaptive matching radio frequency (RF) architecture, comprising a power amplifier module, a receiving module, an antenna, a RF processing module, a baseband control module and at least one adjustable matching network module, wherein the at least one adjustable matching network module comprises a first adjustable matching network module, a second adjustable matching network module and a third adjustable matching network module, the first adjustable matching network module is disposed between the antenna and the RF processing module and directly connected to the antenna and the RF processing module, the second adjustable matching network module is disposed between the receiving module and the RF processing module and directly connected to the receiving module and the RF processing module, and the third adjustable matching network module is disposed between the power amplifier module and the RF processing module and directly connected to the power amplifier module and the RF processing module; the baseband control module is independent from the RF processing module, wherein the baseband control module is pre-stored with matching values corresponding to a plurality of different application scenarios, the corresponding matching values of the at least one adjustable matching network module being applied based on the application scenarios in order to attain an optimum RF performance; the baseband control module configures the matching values of the at least one adjustable matching network module through a hardware interface to attain the optimum RF performance, and is configured to plan the application scenarios for the radio frequency, test the application scenarios to determine the corresponding matching values, and make a lookup table and store the same; the application scenarios comprise at least one of a working channel, an ambient temperature, antenna load matching and software specifying.

2. The RF architecture according to claim 1, wherein the baseband control module is further configured to:
   determine the current application scenario;
   search the lookup table based on the current application scenario to acquire the corresponding matching values of the at least one adjustable matching network module; and
   configure the at least one adjustable matching network module based on the matching values of the at least one adjustable matching network module to attain the optimum RF performance.

3. The RF architecture according to claim 2, wherein the baseband control module monitors through software, in real time, the current application scenario used, and determines the current application scenario.

4. The RF architecture according to claim 1, wherein each of the first adjustable matching network module, the second adjustable matching network module and the third adjustable matching network module comprises an adjustable inductor or an adjustable capacitor.

5. The RF architecture according to claim 1, wherein the baseband control module stores, in advance, the matching values corresponding to the plurality of different application scenarios into software or a non-volatile storage.

6. The RF architecture according to claim 1, wherein the optimum RF performance comprises optimum power consumption or an optimum receptivity.

7. An adaptive matching RF architecture, comprising a power amplifier module, a receiving module, an antenna, a RF processing module, a baseband control module and at least one adjustable matching network module, wherein the at least one adjustable matching network module comprises a first adjustable matching network module, a second adjustable matching network module and a third adjustable matching network module, the first adjustable matching network module is disposed between the antenna and the RF processing module and directly connected to the antenna and the RF processing module, the second adjustable matching network module is disposed between the receiving module and the RF processing module and directly connected to the receiving module and the RF processing module, and the third adjustable matching network module is disposed between the power amplifier module and the RF processing module and directly connected to the power amplifier module and the RF processing module; the baseband control module is independent from the RF processing module;

wherein the baseband control module is pre-stored with matching values corresponding to a plurality of different application scenarios, the corresponding matching values of the at least one adjustable matching network module being applied based on the application scenarios in order to attain an optimum RF performance, and the baseband control module configures the matching values of the at least one adjustable matching network module through a hardware interface to attain the optimum RF performance.

8. The RF architecture according to claim 7, wherein the baseband control module is configured to:
plan the application scenarios for the radio frequency; and
test the application scenarios to determine the corresponding matching values, and make a lookup table and store the same.

9. The RF architecture according to claim 8, wherein the baseband control module is further configured to:
determine the current application scenario;
search the lookup table based on the current application scenario to acquire the corresponding matching values of the at least one adjustable matching network module; and
configure the at least one adjustable matching network module based on the matching values of the at least one adjustable matching network module to attain the optimum RF performance.

10. The RF architecture according to claim 9, wherein the baseband control module monitors through software, in real time, the current application scenario used, and determines the current application scenario.

11. The RF architecture according to claim 7, wherein each of the first adjustable matching network module, the second adjustable matching network module and the third adjustable matching network module, comprises an adjustable inductor or an adjustable capacitor.

12. The RF architecture according to claim 7, wherein the application scenarios comprise at least one of a working channel, an ambient temperature, antenna load matching, and software specifying.

13. The RF architecture according to claim 7, wherein the baseband control module stores, in advance, the matching values corresponding to the plurality of different application scenarios into software or a non-volatile storage.

14. The RF architecture according to claim 7, wherein the optimum RF performance comprises optimum power consumption or an optimum receptivity.

15. A matching method of an adaptive matching RF architecture, the RF architecture comprising a power amplifier module, a receiving module, an antenna, a RF processing module, a baseband control module and at least one adjustable matching network module, wherein the at least one adjustable matching network module comprises a first adjustable matching network module, a second adjustable matching network module and a third adjustable matching network module, the first adjustable matching network module is disposed between the antenna and the RF processing module and directly connected to the antenna and the RF processing module, the second adjustable matching network module is disposed between the receiving module and the RF processing module and directly connected to the receiving module and the RF processing module, and the third adjustable matching network module is disposed between the power amplifier module and the RF processing module and directly connected to the power amplifier module and the RF processing module; the baseband control module is independent from the RF processing module;

the method comprising:
pre-storing, by the baseband control module, matching values corresponding to a plurality of different application scenarios;
applying, by the baseband control module, the corresponding matching values of the at least one adjustable matching network module based on the application scenarios to attain an optimum RF performance, and configuring by the baseband control module the matching values of the at least one adjustable matching network module through a hardware interface to attain the optimum RF performance.

16. The matching method according to claim 15, wherein the step of pre-storing, by the baseband control module, the matching values corresponding to the plurality of different application scenarios comprises:
planning, by the baseband control module, the application scenarios for the radio frequency; and
testing the application scenarios to determine the corresponding matching values, and making a lookup table and storing the same.

17. The matching method according to claim 16, wherein the step of applying by the baseband control module the corresponding matching values of the at least one adjustable matching network module based on the application scenarios so as to attain the optimum RF performance comprises:
determining, by the baseband control module, the current application scenario;
searching the lookup table based on the current application scenario to acquire the corresponding matching values of the at least one adjustable matching network module; and
configuring the adjustable matching network module based on the matching values of the at least one adjustable matching network module to attain the optimum RF performance.

18. The matching method according to claim 15, wherein the application scenarios comprise at least one of a working channel, an ambient temperature, antenna load matching, and software specifying.

19. The method according to claim 15, wherein the step of pre-storing by the baseband control module the matching values corresponding to the plurality of different application scenarios comprises:
pre-storing by the baseband control module the matching values corresponding to the plurality of different application scenarios into software or a non-volatile storage.

20. The method according to claim 15, wherein each of the first adjustable matching network module, the second adjustable matching network module and the third adjustable matching network module, comprises an adjustable inductor or an adjustable capacitor.

* * * * *